United States Patent [19]

Tokonami et al.

[11] Patent Number: 5,134,455
[45] Date of Patent: Jul. 28, 1992

[54] SEMICONDUCTOR INTEGRATED CIRCUIT DEVICE

[75] Inventors: Katsuji Tokonami, Tokyo; Shigeo Ohshima, Yokohama, both of Japan

[73] Assignee: Kabushiki Kaisha Toshiba, Kawasaki, Japan

[21] Appl. No.: 708,993

[22] Filed: May 31, 1991

[30] Foreign Application Priority Data

May 31, 1990 [JP] Japan .................................. 2-141883

[51] Int. Cl.$^5$ ...................... H01L 27/02; H01L 23/48
[52] U.S. Cl. .......................................... 357/40; 357/68
[58] Field of Search ...................................... 357/40, 68

Primary Examiner—Mark V. Prenty
Attorney, Agent, or Firm—Foley & Lardner

[57] ABSTRACT

There is disclosed a semiconductor integrated circuit device comprising: an external input signal lead provided outside a semiconductor chip; a power supply lead provided outside the semiconductor chip; a first electrode connected to an internal circuit on the semiconductor chip, and arranged close to the external input signal lead, wherein when the circuit is caused to be operative, the first electrode is connected to the external input signal lead; and a second electrode connected to the first electrode on the semiconductor chip, and arranged close to said power supply lead, wherein when the circuit is not caused to be operative, the second electrode is connected to the power supply lead. This invention is applicable to the device wherein there are provided a plurality of internal circuits. In this case, a plurality of the first electrodes drawn out from the internal circuits are arranged close to the external input signal lead, and a plurality of the second electrodes similarly drawn out from the internal circuits are arranged close to the power supply lead.

2 Claims, 2 Drawing Sheets

SEMICONDUCTOR INTEGRATED CIRCUIT DEVICE

BACKGROUND OF THE INVENTION

This invention relates to a semiconductor integrated circuit device, and more particularly to a device capable of exhibiting different functions by the same semiconductor chip.

In general, in semiconductor integrated circuit devices, there are instances where non-connection (NC) terminals which are not connected to the circuit exist in the semiconductor chip. In such case, with a view to adding a new function or functions to semiconductor integrated circuits through the implementation of semiconductor integrated circuits of a multi-functional structure, there have been many occasions where NC terminals are used as terminals for inputting external signals.

In such cases in order not to bring on lowering of productivity, even in cases where a new function is added, it is necessary to maintain the fundamental function conventionally given as it is, to thus ensure compatibility. In the case where a NC terminal is used as the electrode for inputting an external signal and the internal circuit is not used, if that NC terminal is brought into a floating state, there is the possibility that an erroneous operation of the internal circuit may take place. Accordingly, it is required to hold the NC terminal at a positive or negative power supply potential.

For this reason, in conventional devices, in the case where an internal circuit is formed with a view to adding a new function in the semiconductor chip of the package, when this internal circuit is used, a lead for inputting an external signal is connected to an electrode drawn out from the internal circuit for the purpose of inputting an external signal In this case, when this internal circuit is not used, it is necessary to connect that external signal input electrode to a power supply terminal provided outside the chip so that a potential on the external signal input electrode is not placed in a floating state. Accordingly, it is necessary that the electrode be provided at a position close to the power supply terminal. For this reason, internal wiring is required.

However, since a semiconductor manufacturing mask is required in order to form such an internal wiring, two kinds of masks must be prepared for the case where the internal circuit is made operative and the case where the internal circuit is not made operative. Thus, there results increased cost and lowered productive efficiency.

Further, it is conceivable to take measures to connect the internal circuit and one external signal input electrode to further connect the external signal input terminal and an external signal input lead, or to connect the external signal input electrode and a power supply lead. However, in this case, it is required that the external signal input lead and the power supply lead be adjacent to each other, and that the external signal input electrode be provided in the vicinity of these leads. This results in the problem that the circuit design and the chip layout design are greatly restricted.

SUMMARY OF THE INVENTION

Accordingly, an object of this invention is to provide a semiconductor integrated circuit device which is capable of attaining reduced cost and improved productivity, and which is of a structure such that the circuit design and the layout design of the chip are not restricted.

According to the present invention, there is provided a semiconductor integrated circuit device comprising: a lead for inputting an external input signal provided outside a semiconductor chip, a lead for a power supply provided outside said semiconductor chip, a first electrode connected to an internal circuit on said semiconductor chip, and arranged close to said lead for inputting an external input signal, wherein when said circuit is caused to be operative, said first electrode is connected to said lead for inputting an external input signal, and a second electrode connected to said first electrode on said semiconductor chip, and arranged close to said lead for a power supply, wherein when the circuit is not caused to be operative, said second electrode is connected to said lead for power supply.

In accordance with this invention, since there are provided first and second electrodes close to an external signal input lead and a power supply lead, respectively, when the circuit is caused to be operative, the first electrode and the external signal input lead are connected. Thus, a signal is inputted from the external to the circuit. In contrast, when the circuit is not made operative, the second electrode connected to the first electrode and the power supply lead are connected. As a result, a potential on the first electrode is held at a power supply potential. Thus, an erroneous operation is prevented. Since selection of functions is carried out by changing the connection relationship between the electrodes and the leads without affecting the internal wiring of the semiconductor chip by any means in a manner stated above, it is sufficient to use a single kind of a semiconductor manufacturing mask for this purpose. In addition, by providing a potential fixing electrode, there is no inconvenience such as the circuit design and the layout design being restricted by the positional relationship of the power supply lead and the external signal input lead.

BRIEF DESCRIPTION OF THE DRAWINGS

In the accompanying drawings.

DESCRIPTION OF THE PREFERRED EMBODIMENTS

Preferred embodiments of this invention will now be described with reference to the attached drawings.

Figure 1:
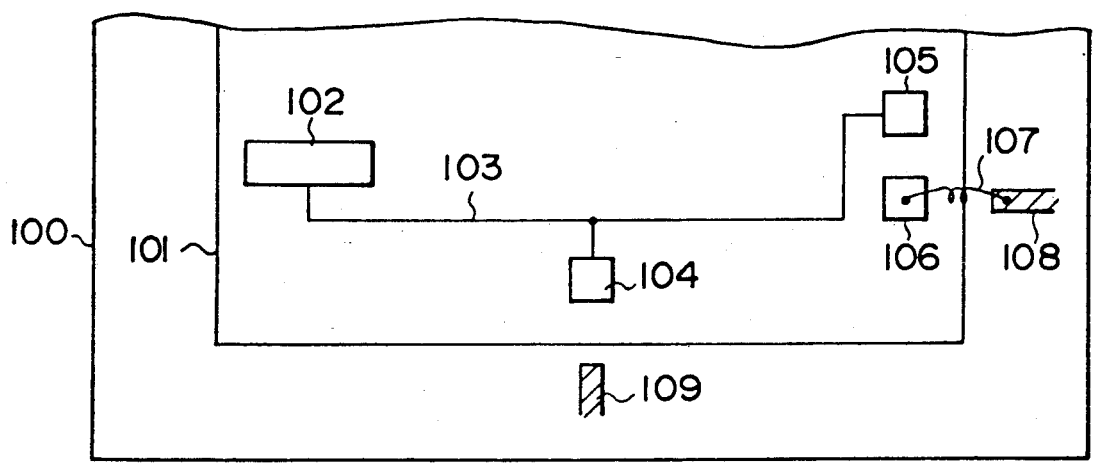
FIG. 1 is a block diagram showing the configuration of a semiconductor integrated circuit device according to an embodiment of this invention.

Initially referring to FIG. 1, there is shown the configuration of a semiconductor integrated circuit device according to an embodiment. An internal circuit 102 newly added is connected to an external signal input electrode 104 by way of an internal wiring 103, and the external signal input electrode 104 is connected to a potential fixing electrode 105. The external signal input electrode 104 is provided close to an external signal input lead 109, and the potential fixing electrode 105 is provided close to a power supply lead 108 and adjacently to a power supply electrode 106. The power supply electrode 106 is connected to the power supply lead 108 by means of a bonding wire 107, and serves to deliver power to respective circuits in a semiconductor chip 101.

Figure 2:
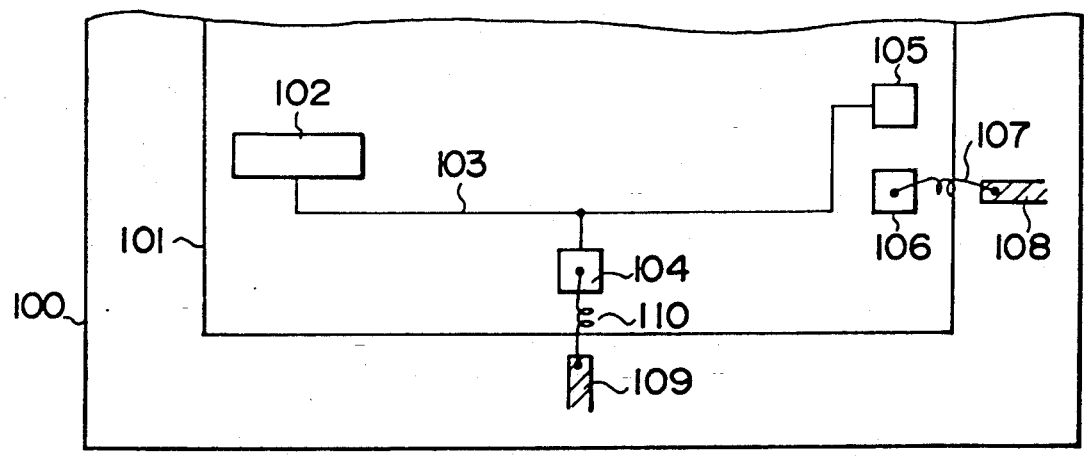
FIG. 2 is a connection diagram showing the state where the internal circuit is used in FIG. 1.
Figure 3:
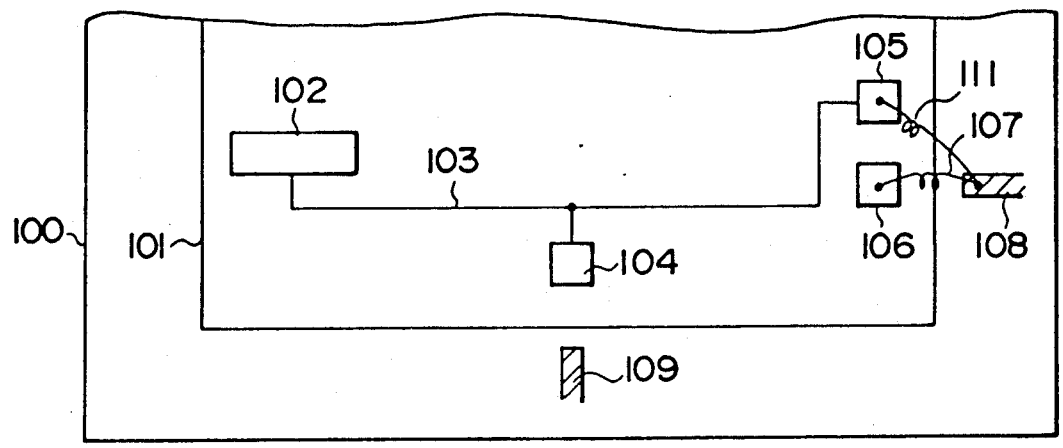
FIG. 3 is a connection diagram showing the state where no internal circuit is used in FIG. 1.

In the case where the internal circuit 102 is caused to be operative, as shown in FIG. 2, the external signal input electrode 104 and the external signal input lead 109 are connected by means of a bonding wire 110, and the potential fixing electrode 105 is not connected to any lead. In contrast, in the case where the internal circuit 102 is not caused to be operative, as shown in FIG. 3, the external signal input electrode 104 is not connected to any lead, and the potential fixing electrode 105 is instead subjected to double bonding to the power supply lead 108 together with the power supply electrode 106 by using a wire 111. Thus, a potential on the external signal input electrode 104 is fixed at a power supply potential, and is not therefore brought into a floating state. As a result, erroneous operation of the internal circuit 102 is prevented.

As described above, in accordance with this embodiment, by changing the designation of the connecting portion of the wire bonding, it is possible to easily make selection of functions. Further, since the wiring 103 in the semiconductor chip 101 is fixed, it is sufficient to use a single kind of a semiconductor manufacturing mask for this purpose. Accordingly, it is possible to deliver many kinds of products by using a single semiconductor chip 101 without addition of mask. Thus, reduced manufacturing cost and improved productivity can be attained. In addition, by providing the potential fixing electrode, the degree of freedom in design can be ensured irrespective of the positions of the external signal input lead and the power supply lead.

It should be noted that the above-described embodiment is only an example, and therefore this invention may be applied to other devices. For example, this invention may be applied not only to a device provided with one internal circuit newly added but also to a device provided with two or more internal circuits newly added.

Figure 4:
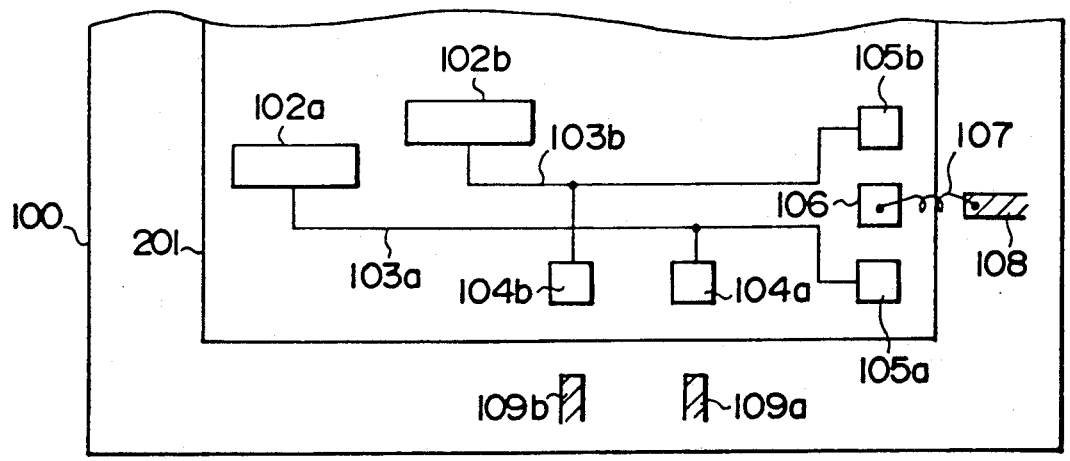
FIG. 4 is a block diagram showing the configuration of a semiconductor integrated circuit device according to another embodiment of this invention.

The device shown in FIG. 4 includes two internal circuits 102a and 102b. In this case, external signal input electrodes 104a and 104b, and potential fixing electrodes 105a and 105b respectively are provided for the internal circuits 102a and 102b. The internal circuit 102a, the external signal input electrode 104a, and the potential fixing electrode 105a are connected by using an internal wiring 103a. Further, the internal circuit 102b, the external signal input electrode 104b and the potential fixing electrode 105b are connected by using an internal wiring 103b.

The external signal input electrode 104a is provided close to the external input lead 109a for delivering a signal to be inputted to the internal circuit 102a, and the external signal input electrode 104b is provided close to the external input lead 109b for delivering a signal to be inputted to the internal circuit 102b. In addition, the potential fixing electrodes 105a and 105b are both positioned at portions adjacent to the power supply electrode 106, respectively.

As described above, in this embodiment, there is employed an arrangement such that wire bonding can be independently implemented to any one of the external signal input lead and the potential fixing lead for respective internal circuits 102a and 102b. For example, in the case where the internal circuit 102a is used and the internal circuit 102b is not used, the external signal input electrode 104a and the external signal input lead 109a are connected, and the potential fixing electrode 105b and the power supply lead 108 are connected. Thus, only by changing the designation of the connection of the wire bonding, it is possible to carry out selection of functions.

As described above, in accordance with this invention, in the case of operating a newly added circuit, the first electrode and the external signal input lead are connected so that a signal is inputted to the circuit. In contrast, in the case of allowing the circuit to be inoperative, the second electrode connected to the first electrode and the power supply lead are connected so that a potential on the first electrode is held at a power supply potential to prevent an erroneous operation of the circuit. Accordingly, selection of functions can be carried out by using a single kind of semiconductor manufacturing mask without affecting the internal wiring of the semiconductor chip by any means. Thus, reduced cost and improved productivity can be attained.

What is claimed is:

1. A semiconductor integrated circuit device comprising:
   a lead for inputting an external input signal provided outside a semiconductor chip,
   a lead for a power supply provided outside said semiconductor chip,
   a first electrode connected to an internal circuit on said semiconductor chip, and arranged close to said lead for inputting an external input signal, wherein when said circuit is caused to be operative, said first electrode is connected to said lead for inputting an external input signal, and
   a second electrode connected to said first electrode on said semiconductor chip, and arranged close to said lead for power supply, wherein when the circuit is not caused to be operative, said second electrode is connected to said lead for a power supply.

2. A semiconductor integrated circuit device as set forth in claim 1, wherein there are provided a plurality of internal circuits, a plurality of said first electrodes drawn out from said internal circuits being arranged close to said lead for inputting an external input signal, a plurality of said second electrodes similarly drawn out from said internal circuits being arranged close to said lead for a power supply.

* * * * *